July 30, 1957 N. M. BENGS 2,801,197
ELECTRIC TERMINAL
Filed July 7, 1954
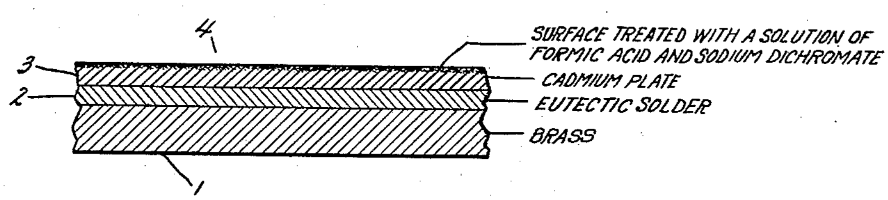
Inventor:
Norbert M. Bengs,
by Robert G. Ing
His Attorney.

United States Patent Office 2,801,197

Patented July 30, 1957

2,801,197

ELECTRIC TERMINAL

Norbert M. Bengs, Fort Wayne, Ind., assignor to General Electric Company, a corporation of New York Application July 7, 1954, Serial No. 441,836

12 Claims. (Cl. 148—31.5)

This invention relates to terminals for connecting leads to electrically operated devices and more particularly to terminals adapted to have electrical leads soldered thereto.

Terminals are used on many electrical devices, such as small transformers, in order to connect electrical leads thereto. In many instances, such terminals are adapted to have the leads soldered thereto rather than connected mechanically as by a screw. In the past, such terminals have generally been formed of brass and have been plated with a suitable metal, such as cadmium, in order to prevent corrosion. In addition, in the case of small transformers having a metal case, the entire unit after assembly of the terminals thereon is frequently cadmium plated followed by the application of a solution of formic acid and sodium dichromate, referred to commercially as an Iridite treatment, in order to further inhibit corrosion. A treatment of this type is described in Patent 2,393,663 to Robert M. Thomas and Charles W. Ostrander. It is thus seen that the terminals of the transformer may have a double plating of cadmium together with an Iridite treatment.

It has been found that it is difficult to make a satisfactory soldered connection to a cadmium plated terminal since the plating must be removed in order to effect an alloy action of the solder to the base metal of the terminal, generally brass. It has been further found that the Iridite treatment makes it even more difficult to break through to the base metal of the terminal to secure a good low resistance soldered connection.

It is therefore desirable to provide a terminal which will resist corrosion and to which cadmium plating and Iridite treatment can be applied, but which can be readily soldered to an electrical lead.

It is therefore an object of this invention to provide an improved electrical terminal incorporating the desirable features set forth above.

Further objects and advantages of this invention will become apparent by reference of the following description and the accompanying drawing, and the features of novelty which characterize this invention will be pointed out with particularity in the claims annexing to and forming a part thereof.

This invention in its broadest aspects provides a terminal having a base formed of conductive metal having at least one side coated with solder and with a coating of cadmium over the solder. The cadmium may be further treated with a solution of formic acid and sodium dichromate. When heat is applied to this terminal in order to solder an electrical lead thereto, the solder under the cadmium plating melts, thus fracturing the coating of cadmium and permitting soldering access to the base metal of the terminal. As the solder builds up below the cadmium coating, the coating is lifted and removed.

The single figure of the drawing is a cross-section view of the improved terminal of this invention.

Referring now to the drawing, there is shown a terminal tip one formed of conductive metal, such as brass. A relatively thin coating of solder 2 is applied to one side of the terminal 1. This may be accomplished by dipping the terminal 1 in hot solder followed by removing excess amounts of the solder in a centrifuge operation or by applying the solder in a plating operation followed by high temperature fusing. The thickness of the coating 2 of solder is preferably .0002 inch to .0005 inch. The solder coating 2 is preferably a tin-lead solder and more particularly, is preferably an eutectic alloy, which is a tin-lead alloy having the lowest melting point of any tin-lead series. Such an alloy consists of approximately 63% tin and 37% lead.

A coating 3 of cadmium, preferably .0002 inch to .0005 inch thick is applied over the solder coating 2, preferably by electrodeposition. In addition, the exterior surface 4 of the cadmium plated coating 3 may be treated with an aqueous solution of formic acid and sodium dichromate, commonly referred to as an Iridite treatment.

It will now be readily seen that when heat is applied to the terminal in order to solder a lead thereto, the coating 2 of the eutectic solder will melt by virtue of its low melting point thus producing fractures in the cadmium plated coating 3 and in the Iridite coating 4 thus permitting soldering access to the terminal 1 through the fractures. As the solder added during the soldering operation builds up on the terminal 1 below the cadmium coating 3, the cadmium 3 and Iridite coating 4 is lifted and removed, thus facilitating a true alloy soldered connection to the terminal 1 and insuring an electrical connection having minimum resistance.

While the terminal 1 is shown on the drawing as being flat with the eutectic solder and cadmium plate applied to only one side, it will be readily understood that the terminal may have both surfaces prepared in the same manner, or may be cylindrical in configuration with its entire peripheral surface coated with eutectic solder and cadmium plate.

It will now be readily seen that this invention provides a terminal which is corrosion resistant and to which cadmium plating and an Iridite treatment may be applied without adversely affecting the solderability of terminal.

While I have shown and described a particular embodiment of this invention, further modification and improvements will occur to those skilled in the art. I desire that it be understood therefore that this invention is not limited to the form shown and I intend in the appended claims to cover all modifications which do not depart from the spirit and scope of this invention.

What I claim as new and desire to secure by Letters Patent of the United States is:

1. A terminal having a base formed of conductive metal, said base having at least one side coated with a low melting point tin-lead solder, and a coating of cadmium over said solder.

2. A terminal having a base formed of conductive metal, said base having at least one side coated with solder, a coating of cadmium over said solder, and a corrosion-resistant coating over said cadmium coating formed by treatment with a solution of formic acid and sodium dichromate.

3. A terminal having a base formed of conductive metal, said base having at least one side coated with eutectic low melting point tin-lead solder, and a coating of cadmium over said solder.

4. A terminal having a base formed of conductive metal, said base having at least one side coated with eutectic solder having approximately 63% tin and 37% lead, and a coating of cadmium over said solder.

5. A terminal having a base formed of conductive metal, said base having a relatively thin coating of a low melting point tin-lead solder on at least one side, and a relatively thin coating of cadmium over said solder.

6. A terminal having a base formed of brass, said base having a relatively thin coating of eutectic solder having approximately 63% tin and 37% lead on at least one side, and a relatively thin coating of cadmium over said solder.

7. A terminal having a base formed of brass, said base having a relatively thin coating of eutectic solder having approximately 63% tin and 37% lead on at least one side, a relatively thin coating of cadmium over said solder, and a corrosion-resistant coating over said cadmium coating formed by treatment with a solution of formic acid and sodium dichromate.

8. A terminal having a base formed of conductive metal, said base having a coating of a low melting point tin-lead solder from .0002 inch to .0005 inch thick on at least one side, and a coating of cadmium from .0002 inch to .0005 inch thick over said solder.

9. A terminal having a base formed of conductive metal, said base having a coating of eutectic low melting point tin-lead solder from .0002 inch to .0005 inch thick on at least one side, and a coating of cadmium from .0002 inch to .0005 inch thick over said solder.

10. A terminal having a base formed of conductive metal, said base having a coating of eutectic solder having approximately 63% tin and 37% lead from .0002 inch to .0005 inch thick on at least one side, and a coating of cadmium from .0002 inch to .0005 inch thick over said solder.

11. A terminal having a base formed of conductive metal, said base having a coating of eutectic solder having approximately 63% tin and 37% lead from .0002 inch to .0005 inch thick on at least one side, a coating of cadmium .0002 inch to .0005 inch thick over said solder, and a corrosion-resistant coating over said cadmium coating formed by treatment with a solution of formic acid and sodium dichromate.

12. A terminal having a base formed of brass, said base having a coating of eutectic solder having approximately 63% tin and 37% lead from .0002 inch to .0005 inch thick on at least one side, a coating of cadmium from .0002 inch to .0005 inch thick over said solder, and a corrosion-resistant coating over said cadmium coating formed by treatment with a solution of formic acid and sodium dichromate.

References Cited in the file of this patent

UNITED STATES PATENTS

| | | |
|---|---|---|
| 2,038,551 | Domm | Apr. 28, 1936 |
| 2,035,380 | Wilhelm | Mar. 24, 1936 |
| 2,393,663 | Thomas et al. | Jan. 29, 1946 |
| 2,410,850 | Wasserman | Nov. 12, 1946 |
| 2,525,887 | Frazier et al. | Oct. 17, 1950 |

FOREIGN PATENTS

| | | |
|---|---|---|
| 297,161 | Great Britain | Sept. 20, 1928 |